United States Patent [19]
Lacap

[11] Patent Number: 5,905,299
[45] Date of Patent: May 18, 1999

[54] THERMALLY ENHANCED THIN QUAD FLATPACK PACKAGE

[75] Inventor: Efren M. Lacap, Tustin, Calif.

[73] Assignee: Texas Instruments, Inc., Dallas, Tex.

[21] Appl. No.: 08/796,174

[22] Filed: Feb. 7, 1997

Related U.S. Application Data

[63] Continuation of application No. 08/583,616, Jan. 5, 1996.
[51] Int. Cl.$^6$ .................................................. H01L 23/495
[52] U.S. Cl. .......................... 257/666; 257/675; 257/676; 257/712; 257/796
[58] Field of Search .................................... 257/666, 796, 257/712, 713, 675, 676

[56] References Cited

U.S. PATENT DOCUMENTS

| | | | |
|---|---|---|---|
| 5,225,710 | 7/1993 | Westerkamp | 257/796 |
| 5,402,006 | 3/1995 | O'Donely | 257/675 |
| 5,493,153 | 2/1996 | Arikawa et al. | 257/796 |

*Primary Examiner*—Tom Thomas
*Assistant Examiner*—Roy Potter
*Attorney, Agent, or Firm*—W. Daniel Swayze, Jr.; W. James Brady, III; Richard R. Donaldson

[57] ABSTRACT

The present invention discloses a thermally enhanced Thin Quad Flatpack (TQFP) integrated circuit package. The invention's thermally enhanced TQFP is sufficiently thin for use in small form factor electronic systems such as Personal Computer Memory Card International Association (PCMCIA) Type III (10.5 millimeter) disk drives, modules and cards. Furthermore, the invention's thermally enhanced TQFP is reliable and has a significantly reduced thermal resistivity. Moreover, the invention does not require expensive tooling of the leadframe. Accordingly, the invention's thermally enhanced TQFP's production cost is far below that of comparable thermally enhanced packages. The invention's thermally enhanced TQFP comprises a leadframe having a number of leads. A heat spreader is attached to the bottom of the leadframe. The heat spreader extends to, and is in thermal contact with, the leads of the leadframe. This permits a larger surface for heat dissipation. The leadframe's die pad is attached to the top side of the heat spreader. A semiconductor die is attached to the top side of the die pad. The die is connected to the leads of the leadframe by means of bond wires. The entire unit is inside a plastic mold. According to the invention, to reduce the downset of the die pad, the semiconductor die is thinner than a standard die. This permits use of a die pad while permitting the heat spreader to be in direct contact with the leads of the leadframe.

16 Claims, 3 Drawing Sheets

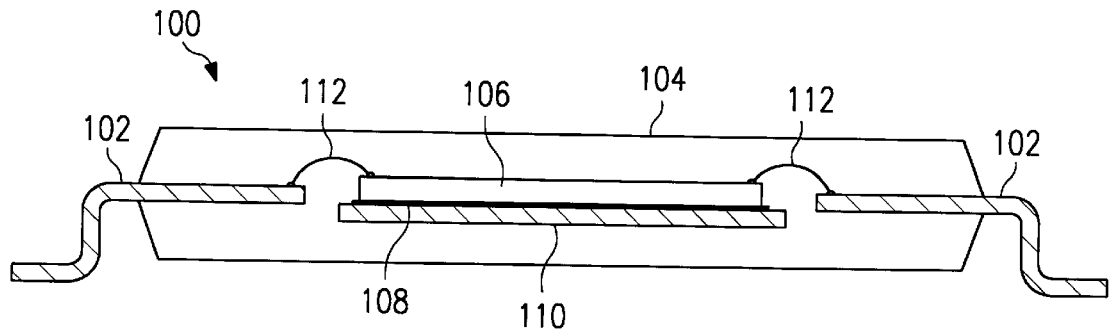
FIG. 1
(PRIOR ART)
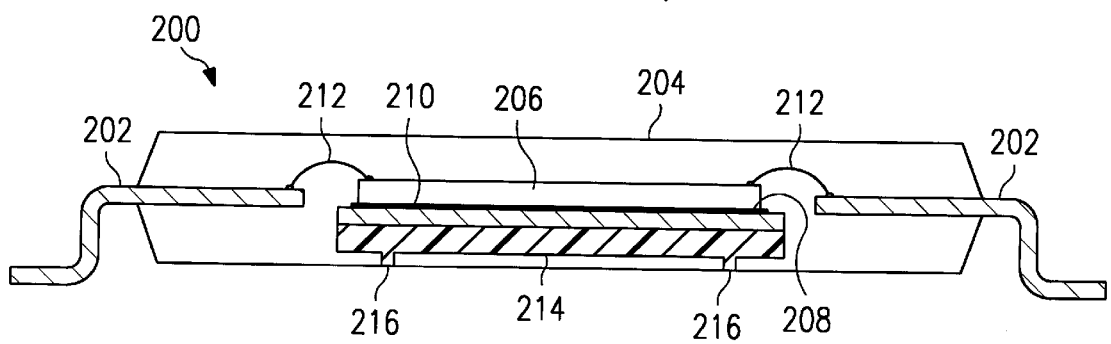
FIG. 2
(PRIOR ART)
FIG. 3
(PRIOR ART)
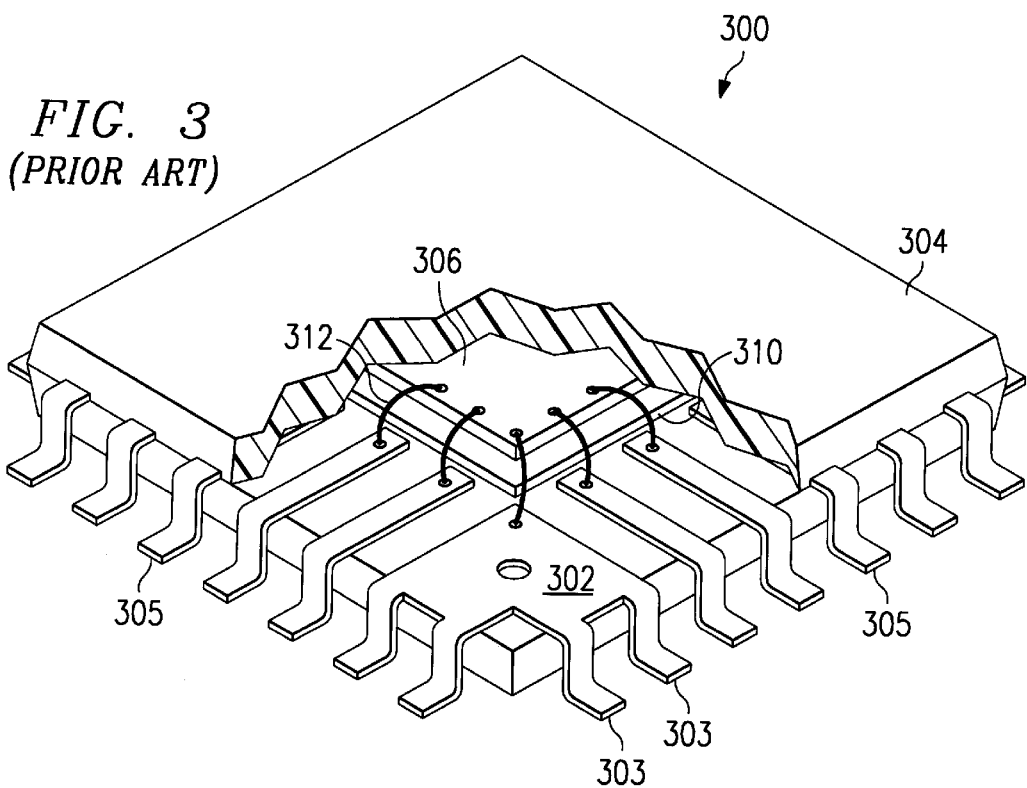

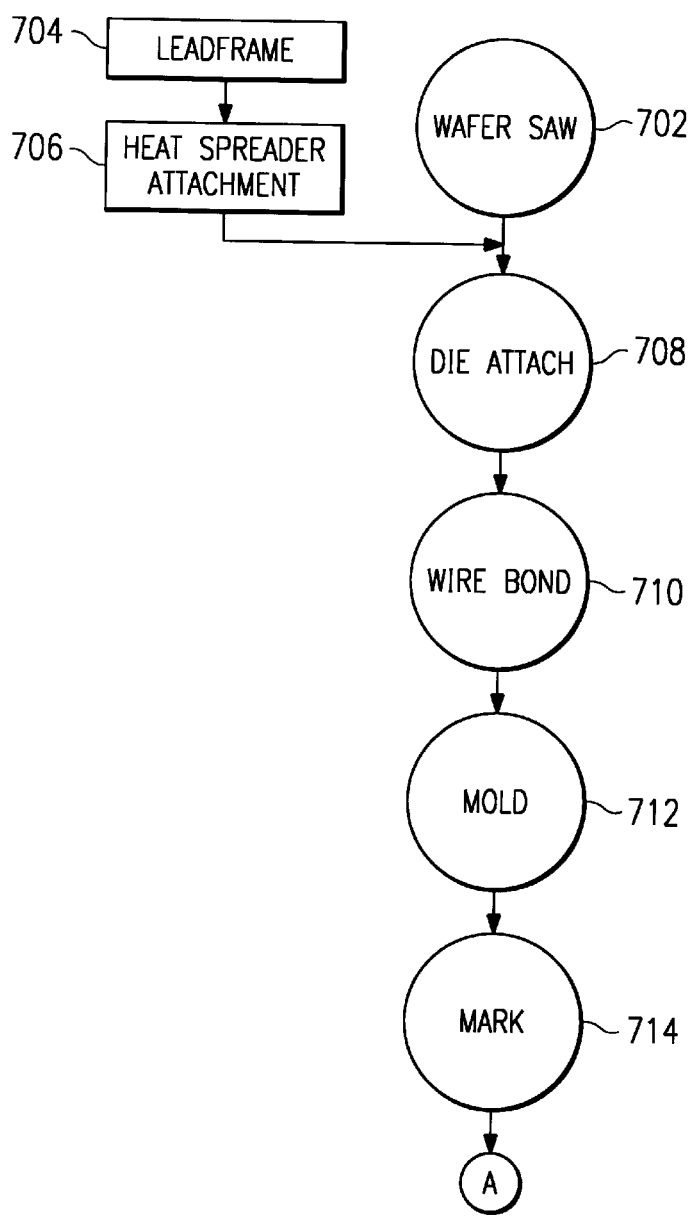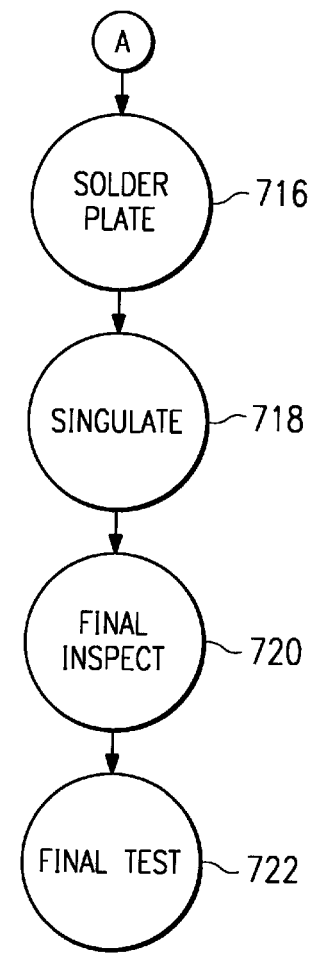

THERMALLY ENHANCED THIN QUAD FLATPACK PACKAGE

This application is a continuation of application Ser. No. 08/583,616, filed Jan. 5, 1996.

BACKGROUND OF THE INVENTION

1. Field of the Invention

The present invention relates to the field of integrated circuit packaging. In particular, the present invention relates to thin quad flatpack packages for integrated circuit devices.

2. Background Art

An integrated circuit device dissipates power primarily in the form of heat. The temperature of the semiconductor substrate depends upon the heat-carrying characteristics of the integrated circuit components and the ambient temperature of the surrounding environment. As the temperature of the semiconductor substrate approaches the highest operating limit of the semiconductor device, the performance of the semiconductor device substantially degrades. Typical semiconductor devices have an ambient operating temperature (also referred to as Ta in this application) ranging from 0° C. to 70° C., although some devices have extended ambient operating temperature ranges, such as from −40° C. to +85° C., or from −55° C. to +125° C. High temperature operation of a semiconductor devices reduces its operating life span, causes it to run at lower speeds, and causes it to display other non-ideal operating characteristics.

High voltage, high current, and high frequency applications often require semiconductor devices to dissipate substantial amounts of power to perform useful functions. Power, dissipated in the form of heat, travels via conduction through the semiconductor substrate into the molding or case enclosing the device. Typically, the enclosure transfers heat directly or indirectly (i.e., by an external heat sink) to the surrounding air. As advances in integration techniques continue to reduce the physical size of semiconductor devices, the size of the integrated circuit packages will be correspondingly reduced. Smaller enclosures have less volume to absorb heat and less surface area to radiate heat away from the semiconductor device. Thus, high density integrated circuits require greater power dissipation ability than low density integrated circuits.

Many applications utilize semiconductor devices in high temperature environments. Military and automotive applications often require semiconductor devices to operate in extreme temperature environments, such as in the desert or within an engine compartment. Miniaturized computer devices may also require high temperature operation of semiconductor devices. Highly-integrated semiconductor devices are utilized to reduce the physical size of computers and other electronic equipment. Integrated circuits are arranged closely together, often near heat-producing power supplies and mass storage devices. Cooling devices, such as air blowers and refrigeration systems, are often omitted from electronic devices to reduce their size, power consumption, cost, and overall complexity. Miniaturization of electronic equipment requires small outline and small profile integrated circuit packages capable of dissipating large amounts of heat.

The heat carrying characteristics of a substance is called its thermal resistance ($\theta$) and is measured in units of degrees Celsius of temperature rise per watt of power dissipated (°C./W). The thermal resistance between a semiconductor substrate and the outside environment may be calculated by summing the thermal resistances of all the intervening structures. In a typical application, thermal resistance may be calculated between a semiconductor junction and the ambient air. The thermal resistance between the junction and the ambient air ($\theta_{J-A}$) is determined by:

$$\theta_{J-A} = \theta_{J-C} + \theta_{C-A}$$

where $\theta_{J-C}$ is the thermal resistance between the junction and the case or enclosure, and $\theta_{C-A}$ is the thermal resistance between the case or enclosure and the ambient air. The junction temperature ($T_J$) is determined by:

$$T_J = T_A + (\theta_{J-A})^* P$$

where Ta is the ambient temperature of the air and P is the power produced by the semiconductor device. Therefore, reducing the thermal resistance between the junction and the ambient air ($\theta_{J-A}$) increases the amount of power that a particular semiconductor device can dissipate at a given ambient temperature.

FIG. 1 shows a typical prior art Thin Quad Flatpack Package (TQFP) 100. TQFP 100 consists of a molded plastic package 104, leadframe 102, semiconductor die 106, die attach epoxy 108, die pad 110, and bond wires 112. As seen in FIG. 1, TQFP 100 does not provide a conductive path for release of the heat energy created by die 106. As a result, TQFP 100 is not suitable for the present and future generation of semiconductor chips which operate at high speeds and power consumption rates. These chips can be best supported by using thermally enhanced Thin Quad Flatpack Packages (TQFP). The thermally enhanced TQFP's permit chip operation at high speeds and power dissipation rates.

Thus far, several thermally enhanced semiconductor packages have been developed. However, each one of these thermally enhanced packages has severe disadvantages that limit its ability to meet today's demands for high speed devices used in small form factor electronic systems. An example of one known thermally enhanced package is package 200 shown in FIG. 2. As with the typical TQFP 100 shown in FIG. 1, package 200 consists of leadframe 202, molded plastic package 204, bond wires 212, semiconductor die 206, thermally conductive and electrically insulative tape 208, and die pad 210. However, package 200 also includes a "Drop-In-Heat Spreader" 214 attached to the underside of die pad 210. The outer surfaces of legs 216 of "Drop-In-Heat Spreader" 214 are exposed to the ambient air. Thus, "Drop-In-Heat Spreader" 214 permits the heat energy created in die 206 to flow to the case (i.e. molded plastic package 204) and the ambient air.

However, "Drop-In-Heat Spreader" 214 has several disadvantages. First, the "Drop-In-Heat Spreader" is limited to thicker package technologies such as Metric Quad Flatpack (MQFP), Small Outline Integrated Circuit (SOIC), Dual-In-Line Package (DIP), and Plastic Leaded Chip Carrier (PLCC). "Drop-In-Heat Spreader" 214 cannot be used in low profile plastic packages such as the TQFP. This is because "Drop-In-Heat Spreader" 214 is mechanically attached to die pad 210 (without use of an adhesive tape). In other words, legs 216 (instead of an adhesive tape) ensure that "Drop-In-Heat Spreader" 214 is in contact with die pad 210. Legs 216 extend from the bottom of "Drop-In-Heat Spreader" 214 to the bottom surface of package 204. Thus, legs 216 significantly add to the height of package 204. The high profile of package 204 (typically about 2.7 millimeters) prevents use of the "Drop-In-Heat Spreader" technique in small form factor electronic systems such as small form factor disk drives (which require thicknesses of about 1.4 millimeters).

Second, legs 216 of "Drop-In-Heat Spreader" 214 reduce the reliability of "Drop-In-Heat Spreader" 214. The reason is that the mold compound used to form molded plastic package 204 has a different thermal expansion coefficient than legs 216. Since legs 216 extend to the surface of molded plastic package 204, the difference in the thermal expansion coefficients results in creation of gaps at the surface of molded plastic package 204. This in turn results in ingression of moisture into molded plastic package 200. Corrosion due to moisture is a serious threat to reliability of integrated circuits. Third, since "Drop-In-Heat Spreader" 214 is not attached to leadframe 202, package 200 does not have a high heat dissipation ability. This is because the exposed portions of a leadframe would provide a large surface for heat dissipation. In other words, the thermal resistivity of the large exposed surface of a leadframe is relatively small. Accordingly, the heat dissipation ability of package 200 is reduced since "Drop-In-Heat Spreader" 214 is not attached to leadframe 202.

Another example of known thermally enhanced packages is package 300 shown in FIG. 3. Package 300 utilizes a "batwing/crab" configuration. Package 300 consists of molded plastic package 304, leadframe 302, die pad 310, semiconductor die 306, and bond wires 312. In this configuration, one or more of the leads of a "bat wing" leadframe 302 are fused to the die pad to provide increased heat transfer. Thus, while leads 305 are utilized for connection to the circuitry on semiconductor die 306, leads 303 are not connected to the circuitry on die 306, and are fused to the die pad to provide increased heat transfer. The "batwing/crab" configuration has a severe disadvantage in that it can only be used if some leads or pins of the semiconductor package are not used. This requires a package to include more pins than that required for the operation of the semiconductor chip.

Another example of a known thermally enhanced semiconductor package is package 400 shown in FIG. 4. Package 400 consists of leadframe 402, molded plastic package 404, bond wires 412, semiconductor die 406, and thermally conductive and electrically insulative tape 408. Package 400 uses heat spreader 414 for thermal enhancement. Package 400 requires an expensive process for separately tooling leadframe 402. Leadframes typically used in integrated circuit packaging come with a die pad. This die pad (shown, for example, in FIGS. 1 and 2) has been removed in package 400. The removal of the die pad requires an additional step and thus adds to the cost of the integrated circuit package.

In integrated circuit packages, such those shown in FIGS. 1 and 2, the entire internal leadframe (including the die pad portion) is silver plated to provide good thermal conductivity between the semiconductor die and the leadframe die pad. Since package 400 does away with the leadframe die pad, the heat spreader itself is used as a die pad. Accordingly, the heat spreader itself has to be silver plated in order to maintain good thermal connection to the semiconductor die. Thus, package 400 requires an additional step of silver plating the heat spreader. This additional step of silver plating the heat spreader adds to the cost of the package. For the above reasons, the assembly cost for package 400 is approximately twice the cost of assembly of the typical package shown in FIG. 1.

Yet another example of a known thermally enhanced semiconductor package is package 500 shown in FIG. 5. Package 500 utilizes heat sink 516 which is attached to the top side of semiconductor die 506 through thermally conductive and electrically insulative tape 508. Leadframe 502 transfers electrical signals to and from die 506 through bond wires 512. The assembly is encapsulated in molded plastic package 504. The heat sink configuration used in package 500 has several disadvantages. Package 500 requires an expensive process for separately tooling leadframe 502. As stated above, conventional leadframes include a die pad. The die pad (shown, for example, in FIGS. 1 and 2) has been removed in package 500. The removal of the die pad requires an additional step and thus adds to the cost of the integrated circuit package.

Moreover, in integrated circuit packages, such those shown in FIGS. 1 and 2, the entire internal leadframe (including the die pad portion) is silver plated to provide good thermal conductivity between the semiconductor die and the leadframe die pad. Since package 500 does away with the leadframe die pad, the heat sink itself has to be silver plated in order to maintain good thermal connection to the semiconductor die. Thus, package 500 requires an additional step of silver plating the heat sink. This additional step of silver plating the heat sink adds to the cost of the package. For the above reasons, the assembly cost for package 500 is approximately three to five times the cost of assembly of the typical package shown in FIG. 1.

Another disadvantage of package 500 is the poor reliability of the package due to exposed heat sink 516. The reason for the poor reliability is that the mold compound used to form molded plastic package 504 has a different thermal expansion coefficient than heat sink 516. Since heat sink 516 extends to the surface of molded plastic package 504, the difference in the thermal expansion coefficients results in creation of gaps at the surface of molded plastic package 504. This in turn results in ingression of moisture into molded plastic package 500. Corrosion due to moisture is a serious threat to reliability of integrated circuits. One prior art solution is to plate heat sink 516 with corrosion-resistant material. However, this would add to the cost of manufacturing package 500.

Thus, there is need in the art for a thermally enhanced semiconductor package for small form factor electronics systems, which has good heat transfer capability and reliability, and does not require expensive tooling of the leadframe and heat spreader.

SUMMARY OF THE INVENTION

The present invention discloses a thermally enhanced Thin Quad Flatpack (TQFP) integrated circuit package. The invention's thermally enhanced TQFP is sufficiently thin for use in small form factor electronic systems such as Personal Computer Memory Card International Association (PCMCIA) Type III (10.5 millimeter) disk drives, modules and cards. Furthermore, the invention's thermally enhanced TQFP is reliable and has a significantly reduced thermal resistivity. Moreover, the invention does not thermally enhanced TQFP's production cost is far below that of comparable thermally enhanced packages.

The invention's thermally enhanced TQFP comprises a leadframe having a number of leads. A heat spreader is attached to the bottom of the leadframe. The heat spreader extends to, and is in thermal contact with, the leads of the leadframe. This permits a larger surface for heat dissipation. The leadframe's die pad is attached to the top side of the heat spreader. A semiconductor die is attached to the top side of the die pad. The die is connected to the leads of the leadframe by means of bond wires. The entire unit is inside a plastic mold. According to the invention, to eliminate the downset of the die pad, the semiconductor die is thinner than a standard die. This permits use of a die pad while permitting the heat spreader to be in direct contact with the leads of the leadframe.

BRIEF DESCRIPTION OF THE DRAWINGS

FIG. 1 illustrates a standard integrated circuit package without thermal enhancement.

FIG. 2 illustrates a known thermally enhanced integrated circuit package using a Drop-In-Heat Spreader configuration.

FIG. 3 shows another known thermally enhanced integrated circuit package having Batwing/Crab connections.

FIGS. 7A and 7B are flow diagrams illustrating the process for assembling an integrated circuit package according to the invention.

DETAILED DESCRIPTION OF THE PRESENT INVENTION

A thermally enhanced thin quad flatpack package is described. In the following description, numerous specific details are set forth in order to provide a more thorough understanding of the present invention. It will be apparent, however, to one skilled in the art, that the present invention may be practiced without these specific details. In other instances, well known features have not been described in detail so as not to obscure the present invention.

Figure 6:
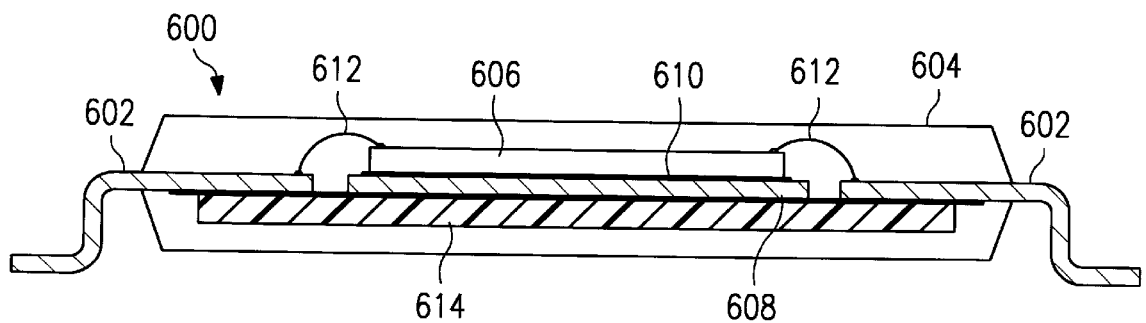
FIG. 6 illustrates the invention's thermally enhanced integrated circuit package.

The invention's thermally enhanced thin quad flatpack package 600 is illustrated in FIG. 6. As shown in FIG. 6, semiconductor die 606 is placed on top of die pad 610. Bond wires 612 connect the circuitry on die 606 to leads 602 of the leadframe. Heat spreader 614 of the present invention is attached to the underside of die pad 610. Heat spreader 614 extends to leads 602 and is in thermal contact with them through a conventional thermally conductive and electrically insulative tape 608. An example of tape 608 is a double-sided adhesive tape which has the following five layers in the order listed. A first inter leaf layer, a first adhesive layer, a polyimide film, a second adhesive layer, and a second inter leaf. The polyimide film can be Kapton™, Upilex, or Apical. As in the prior art packages, tape 608 is typically about 2 mils thick.

Package 600 is made using existing tooled leadframes. A typical plastic leadframe has a die pad "downset" of between five to eight mils. "Downset" refers to the vertical displacement of the die pad with respect to the leadframe. For example, in the prior art package 100 shown in FIG. 1, die pad 110 is shown as being vertically displaced with respect to leadframe 102. In other words, the bottom of die pad 110 is lower than the bottom of leadframe 102. In the typical plastic leadframe (for example package 100 in FIG. 1), the downset results in better layout of the die with the leadframe. This in turn results in improved positioning of the bond wires with respect to the leadframe. However, "downsetting" the die pad requires an extra step and thus adds to the assembly cost of prior art packages. Moreover, the existence of a die pad downset prevents the heat spreader to directly contact the leadframe. For example, heat spreader 214 of FIG. 2 cannot directly contact leadframe 202 due to the misalignment caused by the downset of die pad 210.

According to the present invention, the prior art requirement of a die pad downset is overcome. As explained below, the invention does not require a die pad downset since the semiconductor die of the invention is thinner than the prior art's semiconductor die. Also, the invention utilizes the packaging industry's "low loop" wire bonding technique which makes it easier to perform wire bonding on leadframes with no die pad downset. The "low loop" wire bonding technique and equipment are well known in the semiconductor packaging industry.

Due to elimination of the downset of the die pad in the present invention, the heat spreader of the present invention can directly contact the leadframe. The elimination of the die pad downset permits heat spreader 614 to be attached to die pad 610 while also permitting heat spreader 614 to directly contact leadframe 602. Heat spreader 614 is attached to die pad 610 via a conventional thermally conductive and electrically insulative tape 608. As in typical prior art packages, tape 608 is then cured at high temperature for a certain period of time.

The attachment of die pad 610 to die 606 alleviates the prior art need of directly interfacing the heat spreader with the semiconductor die. The prior art packages required a direct interface between the heat spreader and semiconductor die to bring the heat spreader in contact with the leads of the leadframe. An example of the direct interface is illustrated in the prior art package 400 in FIG. 4. Because of the removal of the downset of the die pad in the present invention, heat spreader 614 is brought in contact (through tape 608) with leads 602 of the leadframe. This is accomplished even though heat spreader 614 is interfacing with die pad 610 and not semiconductor die 606. Thus, according to the invention's package 600, heat spreader 614 does not need to directly interface with die 606.

The invention's thermally enhanced TQFP eliminates the downset of the die pad by utilizing a thinner semiconductor die 606. The thinner semiconductor die is attained by sufficiently back grinding the semiconductor wafer. The invention's thermally enhanced TQFP typically requires a die with a thickness of 10 mils as opposed to the standard thickness of 13.5 mils. The elimination of the die pad downset results in utilization of the existing tooled leadframes. The reason is that the leadframe die pad doe not need to be eliminated. In other words, the elimination of the die pad downset permits the invention's heat spreader to come in contact with the leadframe leads while the heat spreader interfaces with the leadframe die pad and not with the die itself. Thus, the need to modify existing leadframes by removing the die pads is overcome.

Figure 4:
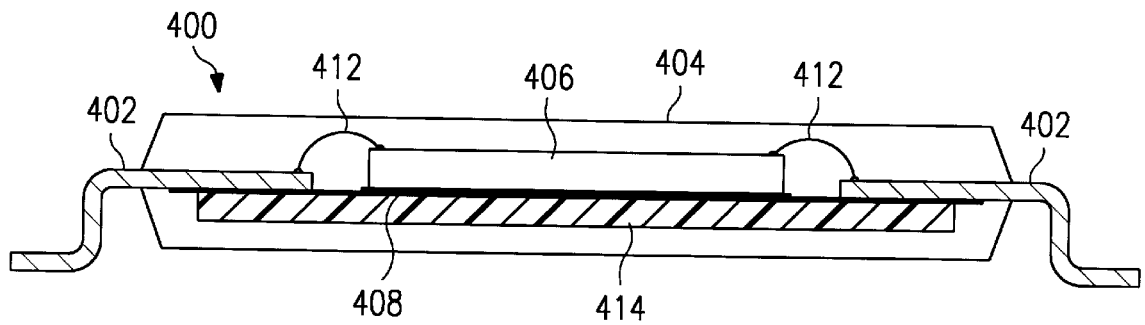
FIG. 4 is another known thermally enhanced integrated circuit package with a heat spreader.

Moreover, unlike heat spreader 414 in FIG. 4, heat spreader 614 of the present invention does not need to be silver plated since it contacts the die pad and not the die itself. This results in additional cost savings in the present invention. The procedure for attaching die pad 610 to heat spreader 614 using the existing tooled leadframe is well defined and automated. Heat spreader 614 is attached to die pad 610 via a conventional thermally conductive and electrically insulative tape 608. An example of tape 608 is a double-sided adhesive tape which has the following five layers in the order listed. A first inter leaf layer, a first adhesive layer, a polyimide film, a second adhesive layer, and a second inter leaf. The polyimide film can be Kapton, Upilex, or Apical. As in the prior art packages, tape 608 is typically about 2 mils thick. As in typical prior art packages, tape 608 is then cured at high temperature for a certain period of time.

In contrast, according to the prior art package 400 of FIG. 4, the downset of the die pad would prevent alignment of the heat spreader with the leads of the leadframe. Thus, according to the prior art package 400, the leadframe die pad has to be removed to bring heat spreader 414 in vertical alignment (and thus in contact) with leads 402 of the leadframe. This requires heat spreader 414 to serve as a die pad and directly interface with semiconductor die 406. This in turn requires that heat spreader 414 be silver plated separately from the leadframe in order to maintain good thermal conductivity with die 406. The silver plating of heat spreader 414 results in the expensive prior art assembly process. As stated above, the invention circumvents the prior art need to silver plate the heat spreader. For the same pin count, the assembly cost of the prior art thermally enhanced TQFP package shown in FIG. 4 is approximately two to five times the assembly cost of the standard (thermally "unenhanced") TQFP package shown in FIG. 1. In contrast, the assembly cost of the invention's thermally enhanced TQFP package 600 is only 1.5 times the assembly cost of the standard (thermally "unenhanced") TQFP package shown in FIG. 1.

A process for assembling the invention's thermally enhanced TQFP is shown in FIGS. 7A and 7B. In step 702, the wafer bearing the semiconductor dies is sawed into separate dies. In step 704, an existing tooled leadframe is provided. In step 706, a heat spreader is attached to the leadframe die pad. The heat spreader is typically made of a copper alloy similar to the leadframe. However, other materials such as aluminum, silicon, and diamond can also be used. As explained above, the heat spreader is attached to the leadframe by a double sided thermally conductive and electrically insulative tape.

In step 708, the die is attached to the leadframe die pad via a thermally conductive and electrically insulating tape (an example of such a tape was given above). In step 710, wire is bonded to the die and the leads of the leadframe. In step 712, the die, leadframe die pad, heat spreader, and the leadframe are encapsulated in a plastic mold compound, while the leads of the leadframe protrude the mold compound. During this step, the entire unit is post-mold cured according to the process appropriate for the mold compound. The post-mold curing process may be performed on the packages after they are taken from the mold. The post-mold curing is performed, for example, for 5 hours and at 150° C. The post-mold curing stabilizes the mold compound and eliminates any potential moisture in the mold compound. Approximately 95% of the mold compound is believed to be cured during the molding process (in the mold) and the remainder of the mold compound is cured during the post-mold curing process. The combination of the molding process and the post-mold curing process results in a package in which the mold compound has fully reacted and is fully cured, thus possessing its optimum properties, such as tensile strength, adhesion to the leadframe, and resistance to the environment. In step 714, the package is marked with identifying marks. In step 716, the leads of the leadframe are solder plated. Solder plating is performed to prevent oxidization of the leads of the leadframe and also to provide better electrical contact during electrical testing of the package. In step 718, the package is singulated. Singulation refers to the cutting off the leads of adjacent leadframes after the molding process. In step 720, the package undergoes a final visual inspection to ensure that the package is complete and no apparent imperfections exist. Finally, in step 722, the package is tested for electrical performance under various conditions.

The invention's thermally enhanced thin quad flatpack package 600 can be used in small form factor electronics systems, is reliable, permits utilization of all available leads and pins in the package, and has good heat transfer capability. Package 600 typically occupies about 1.4 millimeters of vertical space. This thinness of package 600 permits it to be used in many small form factor electronic systems such as Personal Computer Memory Card International Association (PCMCIA) Type III (10.5 millimeter) disk drives, modules and cards.

Figure 5:
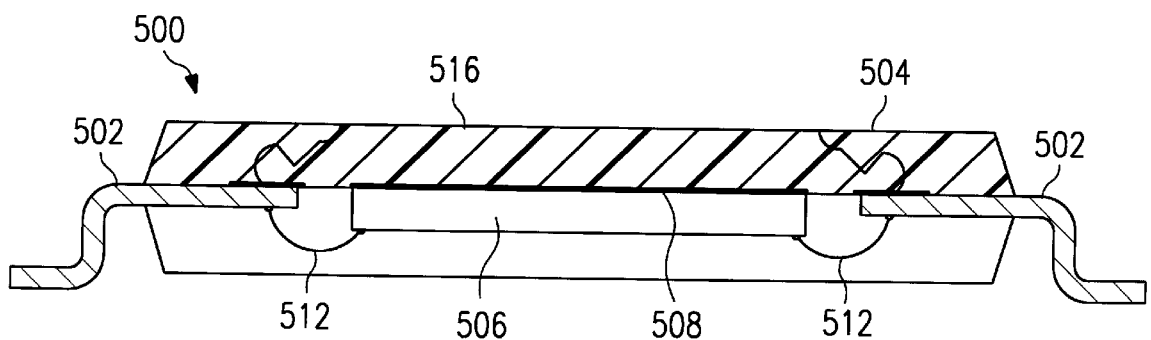
FIG. 5 shows another known thermally enhanced integrated circuit package using a heat sink.

The invention's thermally enhanced package is also very reliable. In the prior art packages 200 and 500 (shown in FIGS. 2 and 5 respectively), the heat spreader (in package 200) or the heat sink (in package 500) are exposed to the surrounding air. The exposed metal can undergo corrosion due to exposure to surrounding moisture. Furthermore, since the heat spreader (in package 200) and the heat sink (in package 500) are positioned near the surface of the mold during the molding process, they may cause a gap in the mold compound. As discussed above, the reason for the creation of gaps is the difference in the thermal expansion coefficient of metal the mold material. The gaps in packages 200 and 500 may result in moisture ingression. If moisture ingression occurs, heat dissipated by the integrated circuit can cause water to become steam. Generation of steam produces increased pressure within the package, causing great stress on the mold compound. The stress may crack the mold compound. In contrast, package 600 of the present invention is a highly reliable package since heat spreader 614 is fully encapsulated by plastic molding 604. Since heat spreader 614 does not extend to the surface of plastic molding 604, the difference in the thermal expansion coefficients of metal and the plastic molding does not result in creation of gaps in package 600.

Moreover, unlike the "batwing/crab" package of FIG. 3, package 600 of the invention permits utilization of all leads and pins available. Accordingly, the requirement of prior art package 300 to include extra leads and pins is overcome.

Furthermore, package 600 of the present invention also provides excellent heat transfer capability. As shown in FIG. 6, heat spreader 614 of the invention is thermally coupled, through thermally conductive tape 608, to leads 602. Heat spreader 614 has a lower thermal resistance than the plastic packaging material. Thus, the large area of the heat spreader and the thermal connection between the heat spreader and the leads of the leadframe contribute to a reduction of the thermal resistance between the semiconductor die and the plastic molding. Thus, as compared with the standard TQFP of FIG. 1, the thermal resistance between the semiconductor die and the plastic case (i.e. $\theta_{J-C}$) has improved in the present invention. Furthermore, the large number of leads 602 act as fins, increasing the total surface area in contact with the ambient air, thus increasing heat transfer to the ambient air. Thus, as compared with the standard TQFP of FIG. 1, the thermal resistance between heat spreader and plastic molding ($\theta_{H-C}$) is significantly improved. Accordingly, as compared with the standard TQFP of FIG. 1, the total thermal resistance between the semiconductor die and plastic molding ($\theta_{J-C}$) is significantly improved. Accordingly, the total thermal resistance between the semiconductor die and ambient air ($\theta_{J-A}$) is significantly improved. The following tables illustrate the reduction in the thermal resistance between semiconductor die 606 and plastic molding 604 ($\theta_{J-C}$), and further between semiconductor die 606 and ambient air ($\theta_{J-A}$) according to one embodiment of the present invention.

TABLE 1

| Package | Body Size | Die Pad Size (mils) | Die Size (mils) | STD TQFP of FIG. 1 $\theta_{J-A}$ (°C./W) | Invention's TQFP $\theta_{J-A}$ (°C./W) |
|---|---|---|---|---|---|
| 64 pin | 10 × 10 × 1.4 | 230 × 230 | 179 × 186 | 68 | 58 |
| 100 pin | 14 × 14 × 1.4 | 360 × 360 | 214 × 235 | 52 | 44 |

TABLE 2

| Package | Body Size | Die Pad Size (mils) | Die Size (mils) | STD TQFP of FIG. 1 $\theta_{J-C}$ (°C./W) | Invention's TQFP $\theta_{J-C}$ (°C./W) |
|---|---|---|---|---|---|
| 64 pin | 10 × 10 × 1.4 | 230 × 230 | 179 × 186 | 25 | 17 |
| 100 pin | 14 × 14 × 1.4 | 360 × 360 | 214 × 235 | 13 | 10 |

The above tables show the invention's reduction in thermal resistance for two different package sizes, a first package having 64 pins and a second package having 100 pins. The body size, die size, and die pad size of the first package are also smaller than those of the second package. In either case, the invention's TQFP results in a significantly improved thermal resistance over the standard TQFP. For example, for the 64 pin package, with a body size of 10 (mm)×10 (mm)×1.4 (mm), a die pad size of 230 (mils)×230 (mils), and a die size of 179 (mils)×186 (mils), the invention's TQFP's thermal resistance between the semiconductor die and the ambient air ($\theta_{J-A}$) is 58 as compared with the standard TQFP's $\theta_{J-A}$ which is 68 (table 1). Moreover, for the same 64 pin package, the invention's TQFP's thermal resistance between the semiconductor die and the plastic molding ($\theta_{J-C}$) is 17 as compared with the standard TQFP's $\theta_{J-C}$ which is 25 (table 2).

In the case of the 100 pin package, with a body size of 14 (mm)×14 (mm)×1.4 (mm), a die pad size of 360 (mils)×360 (mils), a die size of 214 (mils)×235 (mils), and a heat spreader size of 12.5 (mm)×12.5 (mm), the invention's TQFP's thermal resistance between the semiconductor die and the ambient air ($\theta_{J-A}$) is 44 as compared with the standard TQFP's $\theta_{J-A}$ which is 52 (table 1). Moreover, for the same 100 pin package, the invention's TQFP's thermal resistance between the semiconductor die and the plastic molding ($\theta_{J-C}$) is 10 as compared with the standard TQFP's $\theta_{J-C}$ which is 13 (table 2). As illustrated above, the invention results in significant improvement in thermal characteristics of the TQFP.

Although the present invention has been described with reference to an illustrated embodiment, it is appreciated by those skilled in the art that changes in various details may be made without departing from the invention defined in the appended claims. Thus, a thermally enhanced thin quad flatpack package has been described.

I claim:

1. An integrated circuit package comprising:
    a leadframe having a leadframe die pad and a plurality of leads;
    a heat spreader attached to a first side of said leadframe die pad, said heat spreader extending to and attached to at least one of said plurality of leads, wherein said heat spreader does not include supporting legs and wherein said leadframe is without a downset with respect to said leadframe die pad; and
    a die attached to a second side of said leadframe die pad, wherein said leadframe die pad is attached to said heat spreader via a thermally conductive and electrically insulative tape.

2. The integrated circuit package of claim 1 wherein said thermally conductive and electrically insulative tape comprises a polyimide film, said polyimide film being selected from the group consisting of Kapton™, Upilex, and Apical.

3. An integrated circuit package comprising:
    a leadframe having a leadframe die pad and a plurality of leads;
    a heat spreader attached to a first side of said leadframe die pad, said heat spreader extending to and attached to at least one of said plurality of leads, wherein said heat spreader does not include supporting legs and wherein said leadframe is without a downset with respect to said leadframe die pad; and
    a die attached to a second side of said leadframe die pad, wherein said heat spreader is attached to said at least one of said plurality of leads via a thermally conductive and electrically insulative tape.

4. The integrated circuit package of claim 3 wherein said thermally conductive and electrically insulative tape comprises a polyimide film, said polyimide film being selected from the group consisting of Kapton™, Upilex, and Apical.

5. An integrated circuit package comprising:
    a leadframe having a leadframe die pad and a plurality of leads;
    a heat spreader attached to a first side of said leadframe die pad, said heat spreader extending to and attached to at least one of said plurality of leads, wherein said heat spreader does not include supporting legs and wherein said leadframe is without a downset with respect to said leadframe die pad; and
    a die attached to a second side of said leadframe die pad, wherein said package is a Thin Quad Flatpack package.

6. An integrated circuit Package comprising:
    a leadframe having a leadframe die Pad and a plurality of leads;
    a heat spreader attached to a first side of said leadframe die pad, said heat spreader extending to and attached to at least one of said plurality of leads, wherein said heat spreader does not include supporting legs and wherein said leadframe is without a downset with respect to said leadframe die pad; and
    a die attached to a second side of said leadframe die pad, wherein said package is approximately 1.4 millimeters thick.

7. An integrated circuit package comprising:
    a leadframe having a leadframe die pad and a plurality of leads;
    a heat spreader attached to a first side of said leadframe die pad, said heat spreader extending to and attached to at least one of said plurality of leads, wherein said heat spreader does not include supporting legs and wherein said leadframe is without a downset with respect to said leadframe die pad; and
    a die attached to a second side of said leadframe die pad, wherein said die is approximately 10 mil thick.

8. An integrated circuit package comprising:
    a leadframe having a leadframe die pad and a plurality of leads;
    a heat spreader attached to a first side of said leadframe die pad, said heat spreader extending to and attached to at least one of said plurality of leads, wherein said heat spreader does not include supporting legs and wherein said leadframe is without a downset with respect to said leadframe die pad;

a die attached to a second side of said leadframe die pad; and said heat spreader being attached to said first side of said leadframe die pad via a thermally conductive and electrically insulative tape.

9. The integrated circuit package of claim 8 wherein said heat spreader is attached to said at least one of said plurality of leads via a thermally conductive and electrically insulative tape.

10. The integrated circuit package of claim 9 wherein said thermally conductive and electrically insulative tape comprises a polyimide film, said polyimide film being selected from the group consisting of Kapton™, Upilex, and Apical.

11. The integrated circuit package of claim 8 further comprising a plastic molding encapsulating said leadframe, heat spreader, and die.

12. The integrated circuit package of claim 8 wherein said heat spreader is selected from the group consisting of copper alloy, aluminum, silicon, and diamond.

13. The integrated circuit package of claim 8 wherein said thermally conductive and electrically insulative tape comprises a polyimide film, said polyimide film being selected from the group consisting of Kapton™, Upilex, and Apical.

14. The integrated circuit package of claim 8 wherein said package is a Thin Quad Flatpack package.

15. The integrated circuit package of claim 8 wherein said package is approximately 1.4 millimeters thick.

16. The integrated circuit package of claim 8 wherein said die is approximately 10 mils thick.

* * * * *